(12) United States Patent
Park et al.

(10) Patent No.: US 8,742,656 B2
(45) Date of Patent: Jun. 3, 2014

(54) ORGANIC LIGHT EMITTING DEVICE AND METHOD OF MANUFACTURING THE SAME

(75) Inventors: Hongki Park, Seoul (KR); Kyungtak Oh, Seoul (KR); Sammin Ko, Seoul (KR)

(73) Assignee: LG Electronics Inc., Seoul (KR)

( * ) Notice: Subject to any disclaimer, the term of this patent is extended or adjusted under 35 U.S.C. 154(b) by 1229 days.

(21) Appl. No.: 12/015,144

(22) Filed: Jan. 16, 2008

(65) Prior Publication Data

US 2009/0001358 A1    Jan. 1, 2009

(30) Foreign Application Priority Data

Jun. 27, 2007  (KR) .................. 10-2007-0063634

(51) Int. Cl.
*H01L 51/05*    (2006.01)

(52) U.S. Cl.
USPC ............... 313/504; 257/40; 257/E51.006

(58) Field of Classification Search
USPC ............. 257/40, E51.006, E51.033; 313/504, 313/505; 345/205
See application file for complete search history.

(56) References Cited

U.S. PATENT DOCUMENTS

| | | | |
|---|---|---|---|
| 2001/0049197 A1* | 12/2001 | Yamazaki et al. | 438/689 |
| 2003/0057856 A1* | 3/2003 | Yamauchi et al. | 315/169.3 |
| 2005/0046342 A1* | 3/2005 | Park et al. | 313/504 |
| 2005/0116240 A1* | 6/2005 | Kim et al. | 257/88 |
| 2005/0116631 A1* | 6/2005 | Kim et al. | 313/506 |
| 2005/0136344 A1* | 6/2005 | Kang et al. | 430/18 |
| 2005/0285100 A1* | 12/2005 | Jeong et al. | 257/40 |
| 2007/0010036 A1* | 1/2007 | Endo et al. | 438/22 |
| 2007/0276091 A1* | 11/2007 | Son et al. | 525/100 |
| 2007/0287207 A1* | 12/2007 | Fujii | 438/22 |
| 2008/0048562 A1* | 2/2008 | Matsuda | 313/506 |

FOREIGN PATENT DOCUMENTS

| | | |
|---|---|---|
| JP | 2001-175200 A | 6/2001 |
| KR | 10-2003-0068455 A | 8/2003 |
| KR | 10-2004-0071448 A | 8/2004 |
| KR | 10-2005-0052301 A | 6/2005 |
| KR | 10-2007-0079491 A | 8/2007 |

OTHER PUBLICATIONS

Korean Office Action dated Feb. 5, 2009.
Korean Office Action dated Nov. 18, 2008.
Korean Decision to Grant a Patent dated May 22, 2009.

* cited by examiner

*Primary Examiner* — Thomas L. Dickey
(74) *Attorney, Agent, or Firm* — KED & Associates LLP (57) ABSTRACT

An organic light emitting device and a method of manufacturing the same are disclosed. The organic light emitting device includes a substrate, a gate electrode on the substrate, a first insulating film insulating the gate electrode, a semiconductor layer positioned opposite to the gate electrode, a second insulating film insulating the semiconductor layer, source and drain electrodes connected to the semiconductor layer, a first electrode connected to one of the source and drain electrodes, a third insulating film including an opening that exposes the first electrode, a second electrode positioned opposite to the first electrode, and a light emitting layer positioned between the first electrode and the second electrode. A taper angle of an edge area of the third insulating film contacting the first electrode lies substantially in a range between 10° and 50°.

1 Claim, 10 Drawing Sheets

ORGANIC LIGHT EMITTING DEVICE AND METHOD OF MANUFACTURING THE SAME

This application claims the benefit of Korean Patent Application No. 10-2007-0063634 filed on Jun. 27, 2007, which is hereby incorporated by reference.

BACKGROUND

1. Field

An exemplary embodiment relates to a display device, and more particularly, to an organic light emitting device.

2. Description of the Related Art

The importance of flat panel displays has recently increased with the growth of multimedia. Various types of flat panel displays such as liquid crystal displays (LCDs), plasma display panels (PDPs), field emission displays (FEDs), and organic light emitting devices have been put to practical use.

In particular, an organic light emitting device may have a high response speed (of 1 ms or less), a low power consumption, and a self-emitting structure. The organic light emitting device may also not have viewing problems. As such, the organic light emitting device has been considered as a next generation display device.

The organic light emitting device and an active matrix type organic light emitting device depending on a driving manner. In the passive matrix type organic light emitting device, an anode electrode and a cathode electrode cross each other at a right angle, and signal lines are selected to thereby drive the organic light emitting device. In the active matrix type organic light emitting device, a thin film transistor is connected to each pixel electrode, and the organic light emitting device is driven depending on a voltage maintained by capacitance of a capacitor connected to a gate electrode of the thin film transistor.

The organic light emitting device may include a light emitting diode including a first electrode, a light emitting layer, and a second electrode. More specifically, the light emitting diode includes the first electrode supplying holes to each subpixel, the second electrode supplying electrons to each subpixel, and the light emitting layer interposed between the first electrode and the second electrode. The light emitting layer forms excitons by combining the holes received from the first electrode and the electrons received from the second electrode to thereby emit light.

The light emitting diode is formed by evaporating a metal having a high work function such as indium-tin-oxide (ITO) and indium-zinc-oxide (IZO) and then patterning the evaporated metal to form the first electrode in each subpixel, and forming a third insulating film that covers a portion of the first electrode and defines each subpixel.

The light emitting layer is formed on an exposed area of the first electrode exposed by the third insulating film. The light emitting layer may include an organic material or an inorganic material. In case that the light emitting layer may include an organic material, the light emitting layer formed of the organic material may be formed using a thermal evaporation method in which the light emitting layer is evaporated upward by applying heat to an evaporation source.

In the thermal evaporation method, in case that the substrate is close to the evaporation source, an evaporation thickness is uniform. On the contrary, in case that the substrate is far away from the evaporation source, a scattering angle of the evaporation source in an outermost area of the substrate is small. Therefore, an evaporation shadow phenomenon, in which a predetermined area of the light emitting layer is not evaporated, occurs. Accordingly, the evaporation shadow phenomenon reduces the reliability of the organic light emitting device and generates dark spots on an image.

SUMMARY

An exemplary embodiment provides an organic light emitting device capable of improving the reliability and the display quality.

In one aspect, an organic light emitting device comprises a substrate, a gate electrode on the substrate, a first insulating film insulating the gate electrode, a semiconductor layer positioned opposite to the gate electrode, a second insulating film insulating the semiconductor layer, source and drain electrodes connected to the semiconductor layer, a first electrode connected to one of the source electrode and the drain electrode, a third insulating film including an opening that exposes the first electrode, a second electrode positioned opposite to the first electrode, and a light emitting layer positioned between the first electrode and the second electrode, wherein a taper angle of an edge area of the third insulating film contacting the first electrode lies substantially in a range between 10° and 50°.

In another aspect, a method of manufacturing an organic light emitting device comprises forming a gate electrode on a substrate, forming a first insulating film on the gate electrode, forming a semiconductor layer on the first insulating film, forming a second insulating film on the semiconductor layer, forming a first electrode on the second insulating film, forming source and drain electrodes connected to the semiconductor layer, one of the source electrode and the drain electrode being connected to the first electrode, forming a third insulating film on the first electrode, etching the third insulating film so that a taper angle of an edge area of the third insulating film contacting the first electrode lies substantially in a range between 10° and 50°, forming a light emitting layer on the first electrode, and forming a second electrode on the light emitting layer.

In yet another aspect, an organic light emitting device comprises a substrate, a gate electrode on the substrate, a first insulating film insulating the gate electrode, a semiconductor layer positioned opposite to the gate electrode, a second insulating film insulating the semiconductor layer, source and drain electrodes connected to the semiconductor layer, a first electrode connected to one of the source electrode and the drain electrode, a third insulating film including an opening that exposes the first electrode, a second electrode positioned opposite to the first electrode, and a light emitting layer positioned between the first electrode and the second electrode, wherein a taper angle of an edge area of the third insulating film contacting the first electrode lies substantially in a range between 10° and 50°, and a thickness of the third insulating film lies substantially in a range between 0.6 μm and 2 μm as measured from an upper surface of the first electrode.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION

Reference will now be made in detail embodiments of the invention examples of which are illustrated in the accompanying drawings.

Figure 1:
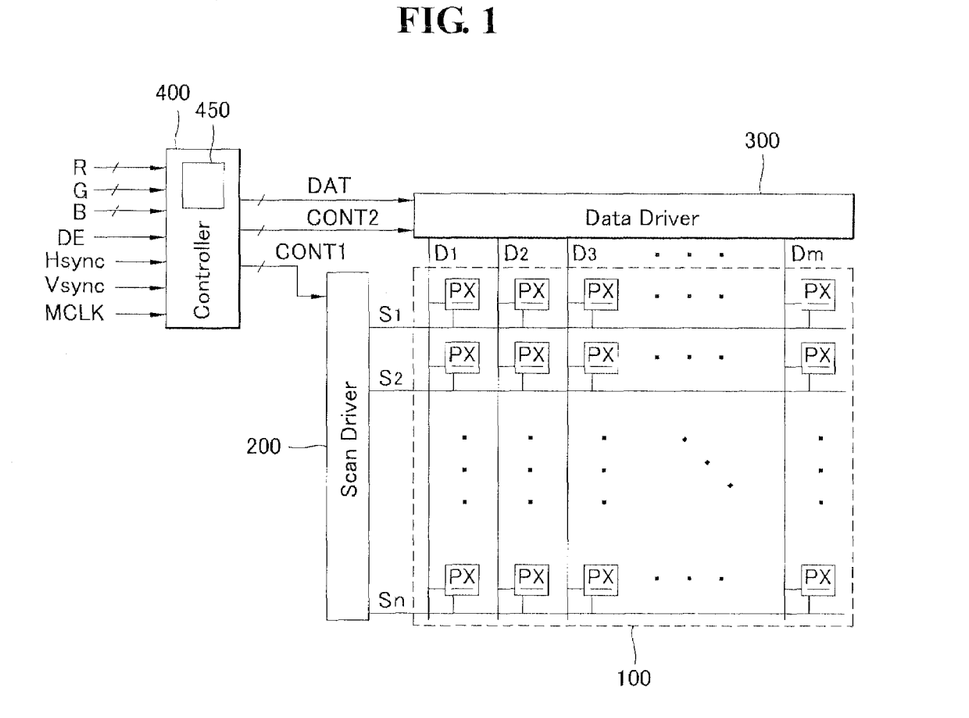
FIG. 1 is a bock diagram of an organic light emitting device according to an exemplary embodiment.
Figure 2A:
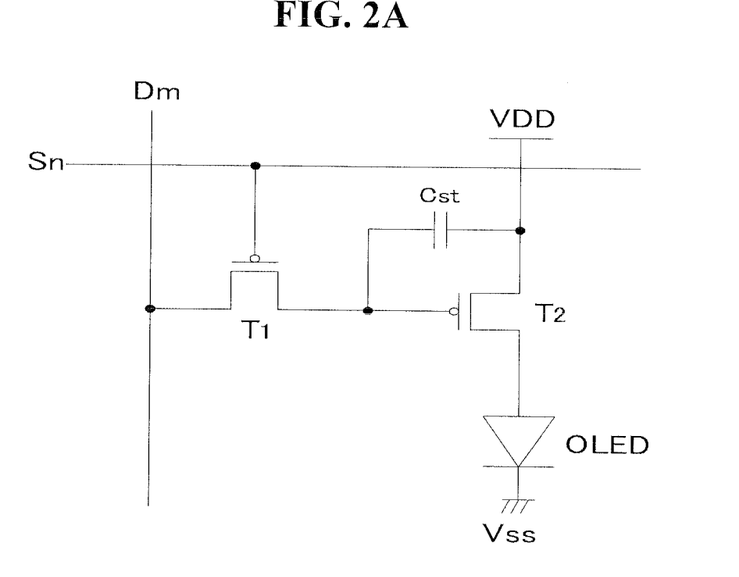
FIGS. 2A and 2B are circuit diagrams of a subpixel of the organic light emitting device.
Figure 2B:
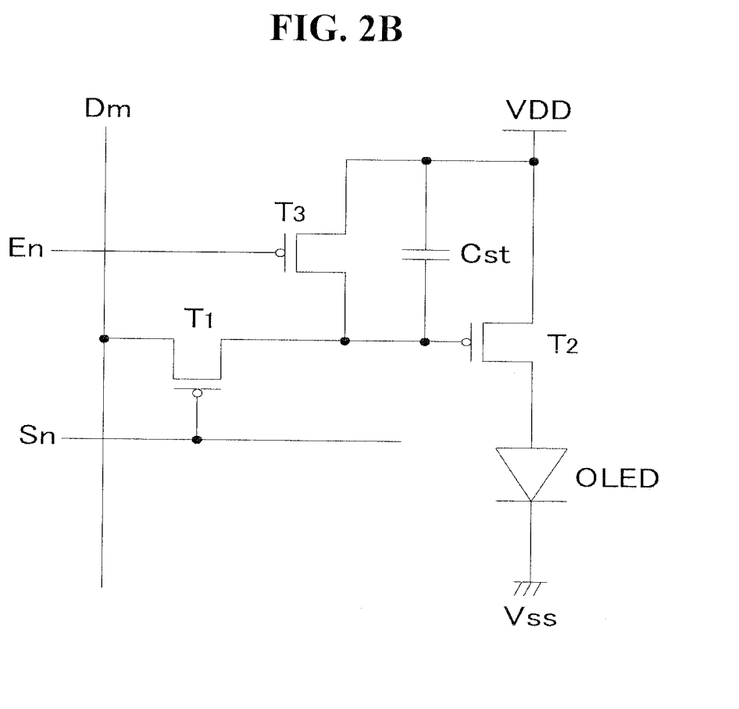

FIG. 1 is a bock diagram of an organic light emitting device according to an exemplary embodiment, and FIGS. 2A and 2B are circuit diagrams of a subpixel of the organic light emitting device.

As shown in FIG. 1, the organic light emitting device according to the exemplary embodiment includes a display panel 100, a scan driver 200, a data driver 300, and a controller 400.

The display panel 100 includes a plurality of signal lines S1 to Sn and D1 to Dm, a plurality of power supply lines (not shown), and a plurality of subpixels PX arranged in a matrix format to be connected to the signal lines S1 to Sn and D1 to Dm and the power supply lines.

The plurality of signal lines S1 to Sn and D1 to Dm may include the plurality of scan lines S1 to Sn for transmitting scan signals and the plurality of data lines D1 to Dm for transmitting data signals. Each power supply line may transmit voltages such as a power voltage VDD to each subpixel PX.

Although the signal lines include the scan lines S1 to Sn and the data lines D1 to Dm in FIG. 1, the exemplary embodiment is not limited thereto. The signal lines may further include erase lines (not shown) for transmitting erase signals depending on a driving manner.

However, the erase lines may not be used to transmit the erase signals. The erase signal may be transmitted through another signal line. For instance, although it is not shown, the erase signal may be supplied to the display panel 100 through the power supply line in case that the power supply line for supplying the power voltage VDD is formed.

As shown in FIG. 2A, the subpixel PX may include a switching thin film transistor T1 transmitting a data signal in response to a scan signal transmitted through the scan line Sn, a capacitor Cst storing the data signal, a driving thin film transistor T2 producing a driving current corresponding to a voltage difference between the data signal stored in the capacitor Cst and the power voltage VDD, and a light emitting diode (OLED) emitting light corresponding to the driving current.

As shown in FIG. 2B, the subpixel PX may include a switching thin film transistor T1 transmitting a data signal in response to a scan signal transmitted through the scan line Sn, a capacitor Cst storing the data signal, a driving thin film transistor T2 producing a driving current corresponding to a voltage difference between the data signal stored in the capacitor Cst and the power voltage VDD, a light emitting diode (OLED) emitting light corresponding to the driving current, and an erase switching thin film transistor T3 erasing the data signal stored in the capacitor Cst in response to an erase signal transmitted through an erase line En.

When the display device is driven in a digital driving manner that represents a gray scale by dividing one frame into a plurality of subfields, the pixel circuit of FIG. 2B can control a light emitting time by supplying the erase signal to the subfield PX whose the light-emission time is shorter than an addressing time. The pixel circuit of FIG. 2B has an advantage capable of reducing a minimum luminance of the display device.

A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

Referring again to FIG. 1, the scan driver 200 is connected to the scan lines S1 to Sn to apply scan signals capable of turning on the switching thin film transistor T1 to the scan lines S1 to Sn, respectively.

The data driver 300 is connected to the data lines D1 to Dm to apply data signals indicating an output video signal DAT' to the data lines D1 to Dm, respectively. The data driver 300 may include at least one data driving integrated circuit (IC) connected to the data lines D1 to Dm.

The data driving IC may include a shift register, a latch, a digital-to-analog (DA) converter, and an output buffer which are connected to one another in the order named.

When a horizontal sync start signal (STH) (or a shift clock signal) is received, the shift register can transmit the output video signal DAT' to the latch in response to a data clock signal (HLCK). In case that the data driver 300 includes a plurality of data driving ICs, a shift register of a data driving IC can transmit a shift clock signal to a shift register of a next data driving IC.

The latch memorizes the output video signal DAT', selects a gray voltage corresponding to the memorized output video signal DAT' in response to a load signal, and transmits the gray voltage to the output buffer.

The DA converter selects the corresponding gray voltage in response to the output video signal DAT' and transmits the gray voltage to the output buffer.

The output buffer outputs an output voltage (serving as a data signal) received from the DA converter to the data lines D1 to Dm, and maintains the output of the output voltage for 1 horizontal period (1H).

The controller 400 controls operations of the scan driver 200 and the data driver 300. The controller 400 may include a signal conversion unit 450 that gamma-converts input video signals R, G and B into the output video signal DAT' and produces the output video signal DAT'.

The controller 400 produces a scan control signal CONT1 and a data control signal CONT2, and the like. Then, the controller 400 outputs the scan control signal CONT1 to the scan driver 200 and outputs the data control signal CONT2 and the processed output video signal DAT' to the data driver 300.

The controller 400 receives the input video signals R, G and B and an input control signal for controlling the display of the input video signals R, G and B from a graphic controller (not shown) positioned outside the organic light emitting device. Examples of the input control signal include a vertical sync signal Vsync, a horizontal sync signal Hsync, a main clock signal MCLK and a data enable signal DE.

Each of the driving devices 200, 300 and 400 may be directly mounted on the display panel 100 in the form of at least one IC chip, or may be attached to the display panel 100 in the form of a tape carrier package (TCP) in a state where the driving devices 200, 300 and 400 each are mounted on a flexible printed circuit film (not shown), or may be mounted on a separate printed circuit board (not shown). Alternatively, each of the driving devices 200, 300 and 400 may be integrated on the display panel 100 together with elements such as the plurality of signal lines S1 to Sn and D1 to Dm or the thin film transistors T1, T2 and T3.

Further, the driving devices 200, 300 and 400 may be integrated into a single chip. In this case, at least one of the driving devices 200, 300 and 400 or at least one circuit element constituting the driving devices 200, 300 and 400 may be positioned outside the single chip.

Figure 3:
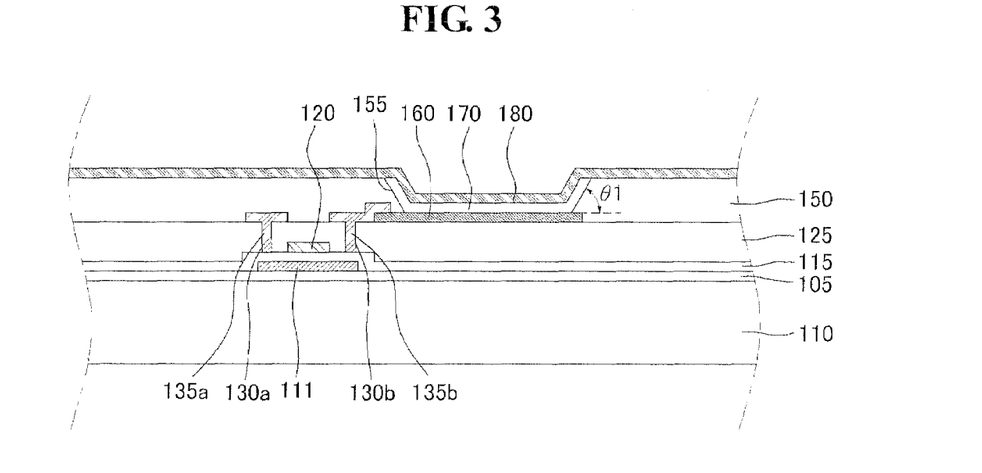
FIG. 3 is a cross-sectional view of the organic light emitting device.

FIG. 3 is a cross-sectional view of the organic light emitting device.

As shown in FIG. 3, a buffer layer 105 is positioned on a substrate 110. A semiconductor layer 111 is positioned on the buffer layer 105. The semiconductor layer 111 may include amorphous silicon or polycrystalline silicon. A first insulating film 115, which may be a gate insulating film, is positioned on the semiconductor layer 111, and a gate electrode 120 is positioned on the first insulating film 115.

A second insulating film 125, which may be an interlayer dielectric, is formed to insulate the gate electrode 120. Contact holes 130b and 130c are positioned inside the second insulating film 125. A source electrode 135a and a drain electrode 135b are positioned to be electrically connected to the semiconductor layer 111 through the contact holes 130b and 130c.

A first electrode 160 is positioned to be electrically connected to any one of the source and drain electrodes 135a and 135b. The first electrode 160 may be positioned under the drain electrode 135b. A third insulating film 150, which may be a bank layer, is positioned on the first electrode 160. The third insulating film 150 includes an opening 155 exposing a predetermined area of the first electrode 160.

A taper angle θ1 of an edge area of the third insulating film 150 contacting the first electrode 160 may lie substantially in a range between 10° and 50°, or a range between 20° and 35°.

When the taper angle θ1 is equal to or more than 10°, the third insulating film 150 can be prevented from being damaged by an electric field concentratedly distributed in an edge area of the first electrode 160, and thus insulating properties of the third insulating film 150 can be improved. When the taper angle θ1 is equal to or less than 50°, an evaporation shadow phenomenon, in which a light emitting layer is not evaporated in the edge area of the first electrode 160 in a succeeding evaporation process of the light emitting layer, can be prevented.

When the taper angle θ1 is equal to or more than 20°, the third insulating film 150 can be further prevented from being damaged by an electric field concentratedly distributed in the edge area of the first electrode 160, and thus insulating properties of the third insulating film 150 can be further improved. When the taper angle θ1 is equal to or less than 35°, the evaporation shadow phenomenon, in which the light emitting layer is not evaporated in the edge area of the first electrode 160 in the succeeding evaporation process of the light emitting layer, can be further prevented.

A light emitting layer 170 is positioned on an exposed area of the first electrode 160, and a second electrode 180 is positioned on the light emitting layer 170.

As described above, in the organic light emitting device according to the exemplary embodiment, the insulating properties of the third insulating film 150 can be improved and the evaporation shadow phenomenon can be prevented by adjusting the taper angle θ1 of the edge area of the third insulating film 150 contacting the first electrode 160.

A method of manufacturing the organic light emitting device according to the exemplary embodiment having the above-described structure will be described below with reference to FIGS. 4A to 4F.

FIGS. 4A to 4F are cross-sectional views successively showing each of process stages in a method of manufacturing the organic light emitting device.

Figure 4A:
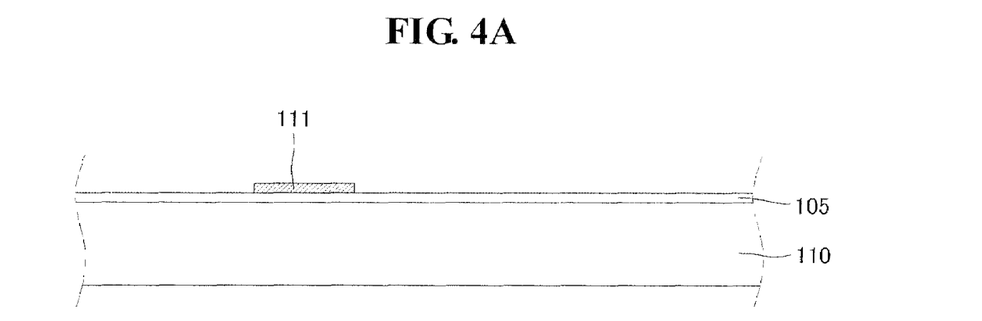
FIGS. 4A to 4F are cross-sectional views successively showing each of process stages in a method of manufacturing the organic light emitting device.

As shown in FIG. 4A, the buffer layer 105 is formed on the substrate 110 formed of glass, plastic or metal. The buffer layer 105 prevents impurities (e.g., alkali ions discharged from the substrate 110) from being introduced during formation of the thin film transistor in a succeeding process. The buffer layer 105 may be selectively formed using silicon oxide ($SiO_2$), silicon nitride ($SiN_x$), or using other materials.

The semiconductor layer 111 is formed on the buffer layer 105. The semiconductor layer 111 may be formed of amorphous silicon or crystallized polycrystalline silicon. Although it is not shown, the semiconductor layer 111 may include a channel region, a source region, and a drain region, and the source region and the drain region may be doped with p-type or n-type impurities.

Figure 4B:
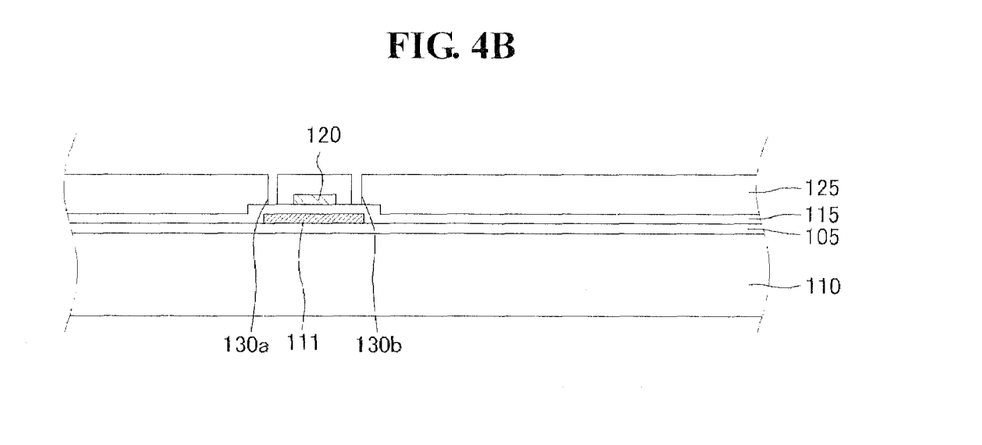

As shown in FIG. 4B, the first insulating film 115 is formed on the substrate 110 including the semiconductor layer 111. The first insulating film 115 may be selectively formed using silicon oxide ($SiO_2$), silicon nitride ($SiN_x$), or using other materials.

Next, the gate electrode 120 is formed on the first insulating film 115 in a given area of the semiconductor layer 110 (e.g., at a location corresponding to the channel region of the semiconductor layer 110 when impurities are doped). The gate electrode 120 may include any one of aluminum (Al), Al alloy, titanium (Ti), silver (Ag), molybdenum (Mo), Mo alloy, tungsten (W), and tungsten silicide ($WSi_2$).

Next, the second insulating film 125 is formed on the substrate 110 including the gate electrode 120. The second insulating film 125 may be an organic film, an inorganic film, or a composite film of the organic film and the inorganic film. In case that the second insulating film 125 is an inorganic film, the second insulating film 125 may include silicon oxide ($SiO_2$), silicon nitride ($SiN_x$), or silicate-on-glass (SOG). In case that the second insulating film 125 is an organic film, the second insulating film 125 may include acrylic resin, polyimide resin, or benzocyclobutene (BCB) resin.

The second insulating film 125 and the first insulating film 115 are etched to form the contact holes 130a and 130b exposing a predetermined area of the semiconductor layer 111.

Figure 4C:
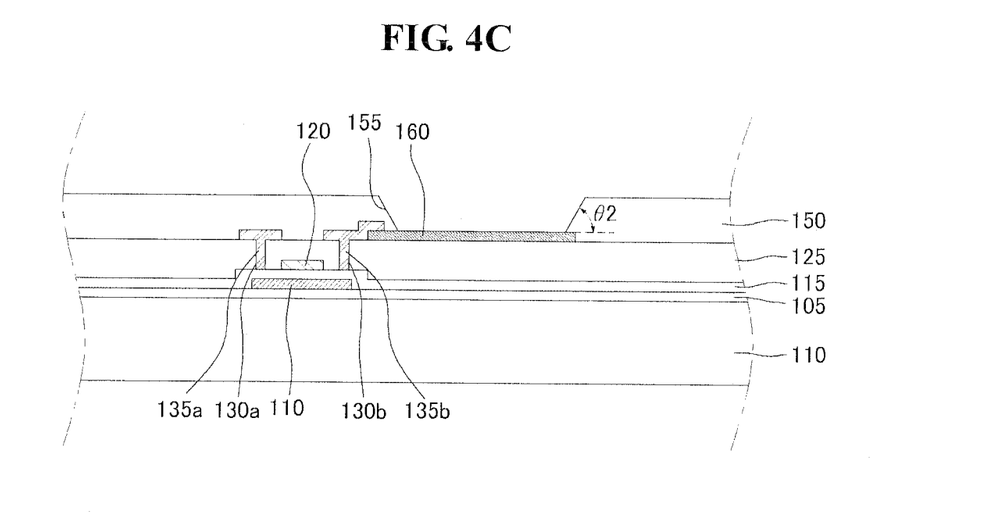

As shown in FIG. 4C, the first electrode 160 is formed on the substrate 110 on which the contact holes 130a and 130b are formed. The first electrode 160 may be an anode electrode and may include a transparent conductive layer such as indium-tin-oxide (ITO) or indium-zinc-oxide (IZO). The first electrode 160 may have a stacked structure of ITO/Ag/ITO.

Next, the source electrode 135a and the drain electrode 135b are formed on the second insulating film 125. The source electrode 135a and the drain electrode 135b are electrically connected to the semiconductor layer 111 through the contact holes 130a and 130b. A portion of the drain electrode 135b is formed on the first electrode 160 and is electrically connected to the first electrode 160.

The source and drain electrodes 135a and 135b may include a low resistance material so as to lower a line resistance. For instance, the source and drain electrodes 135a and 135b may have a multi-layered structure including molybdenum tungsten (MoW), Ti, Al or Al alloy. Examples of the multi-layered structure include a stacked structure of Ti/Al/Ti or MoW/Al/MoW.

Next, the third insulating film 150 is formed on the substrate 110 on which the first electrode 160 is formed. The third insulating film 150 may include an organic material such as benzocyclobutene (BCB) resin, acrylic resin, or polyimide resin. The third insulating film 150 is etched to form the opening 155 exposing a portion of the first electrode 160.

A taper angle $\theta 2$ of the edge area of the third insulating film 150 contacting the first electrode 160 may lie substantially in a range between 10° and 50°. When the taper angle $\theta 2$ is equal to or more than 10°, the third insulating film 150 can be prevented from being damaged by an electric field concentratedly distributed in an edge area of the first electrode 160, and thus the insulating properties of the third insulating film 150 can be improved. When the taper angle $\theta 2$ is equal to or less than 50°, the evaporation shadow phenomenon, in which the light emitting layer 170 is not evaporated in the edge area of the first electrode 160 in a succeeding evaporation process of the light emitting layer 170, can be prevented.

Further, the taper angle $\theta 2$ may lie substantially in a range between 20° and 35°. When the taper angle $\theta 2$ is equal to or more than 20°, the third insulating film 150 can be further prevented from being damaged by an electric field concentratedly distributed in the edge area of the first electrode 160, and thus insulating properties of the third insulating film 150 can be further improved. When the taper angle $\theta 2$ is equal to or less than 35°, the evaporation shadow phenomenon, in which the light emitting layer 170 is not evaporated in the edge area of the first electrode 160 in the succeeding evaporation process of the light emitting layer 170, can be further prevented.

Figure 4D:
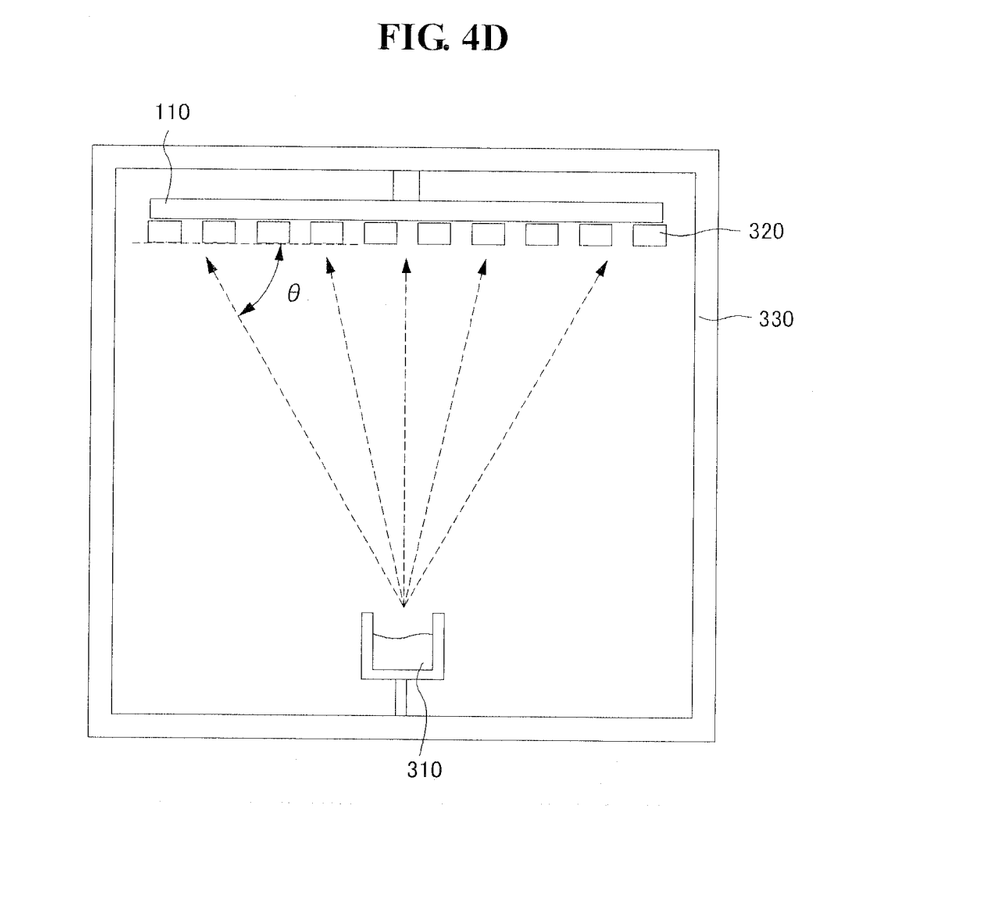

As shown in FIG. 4D, the substrate 110 on which the first electrode 160 and the third insulating film 150 are formed is loaded in a vacuum chamber 330. The vacuum chamber 330 includes an evaporation source 310 including an organic material or an inorganic material. Then, while the substrate 110 and a mask 320 are aligned and heat is applied to the evaporation source 310 positioned in a lower area of the vacuum chamber 330, the light emitting layer 170 is formed on the exposed area of the first electrode 160 exposed by the opening 155 of the third insulating film 150. In FIG. 4D, while the evaporation source 310 is positioned in the lower area of the vacuum chamber 330 at a location corresponding to the middle of the substrate 110, the evaporation source 310 may be positioned outside the substrate 110. In this case, a scattering angle $\theta$ of an evaporation material generated in the evaporation source 310 may lie at least in a range between 35° and 55°.

An evaporation shadow phenomenon of an organic material generated during evaporation of the organic material will be described in detail with reference to FIG. 4E.

Figure 4E:
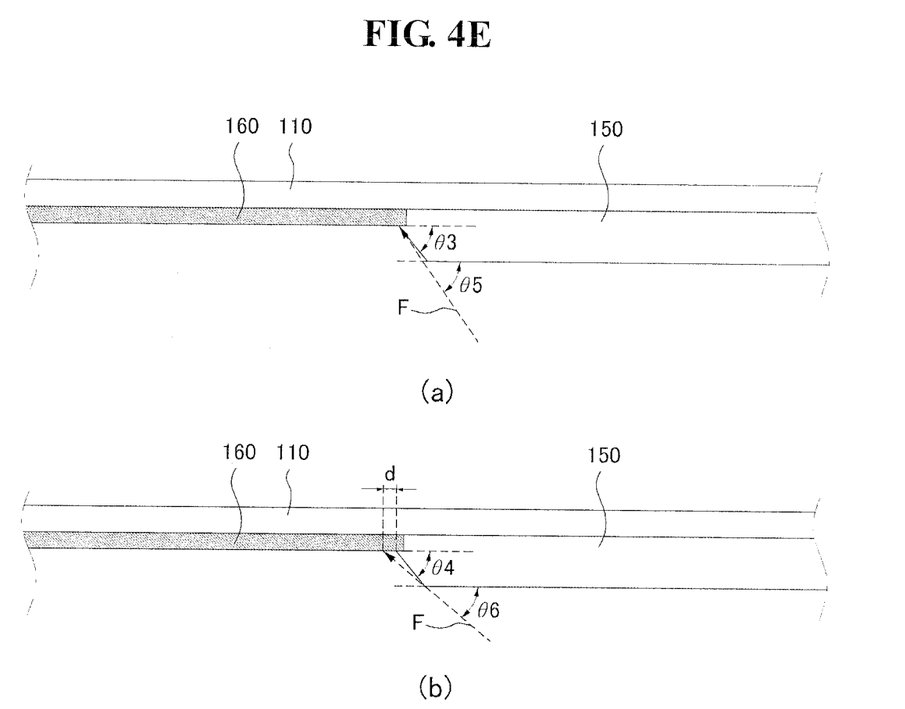

As shown in FIG. 4E, the first electrode 160 is formed on the substrate 110 including the source and drain electrodes 135a and 135b, and the third insulating film 150 is formed to cover a predetermined area of the first electrode 160. A mask 320 is positioned on the third insulating film 150 to evaporate an organic material. FIG. 4E shows an evaporation path (F) of the organic material. A scattering angle $\theta 5$ of the organic material in (a) of FIG. 4E may be substantially equal to a scattering angle $\theta 6$ of the organic material in (b) of FIG. 4E.

In FIG. 4E, (a) schematically shows the evaporation of the organic material in case that a taper angle $\theta 3$ of an edge area of the third insulating film 150 contacting the first electrode 160 lies substantially in a range between 10° and 50°. As shown, when the taper angle $\theta 3$ lies substantially in a range between 10° and 50°, the organic material is evaporated up to the edge area of the third insulating film 150 contacting the first electrode 160.

In FIG. 4E, (b) schematically shows the evaporation of the organic material in case that a taper angle $\theta 4$ of an edge area of the third insulating film 150 contacting the first electrode 160 exceeds 50°. As shown, when the taper angle $\theta 4$ exceeds 50°, an evaporation shadow phenomenon, in which the organic material is not evaporated in the edge area of the third insulating film 150 contacting the first electrode 160 using the mask 120, occurs. In other words, the evaporation shadow phenomenon starts to occur from the edge area of the third insulating film 150 contacting the first electrode 160. As a result, the evaporation shadow phenomenon generates dark spots on an image and easily deteriorates the light emitting layer due to oxygen permeated from the outside. In (b) of FIG. 4E, a reference character "d" indicates an evaporation shadow distance of the first distance 160 on which the organic material is not evaporated using the mask 320.

Accordingly, since the taper angle of the edge area of the third insulating film 150 contacting the first electrode 160 lies substantially in a range between 10° and 50°, or a range between 20° and 35° in the organic light emitting device according to the exemplary embodiment, the display quality of an image displayed on the organic light emitting device can be improved and the reliability of the organic light emitting device can be improved.

Although it is not shown, before forming the light emitting layer 170, a hole injection layer and a hole transport layer may be formed on the substrate 110. After forming the light emitting layer 170, an electron transport layer and an electron injection layer may be formed on the light emitting layer 170. The light emitting layer 170 may be formed using a thermal evaporation method.

Figure 4F:
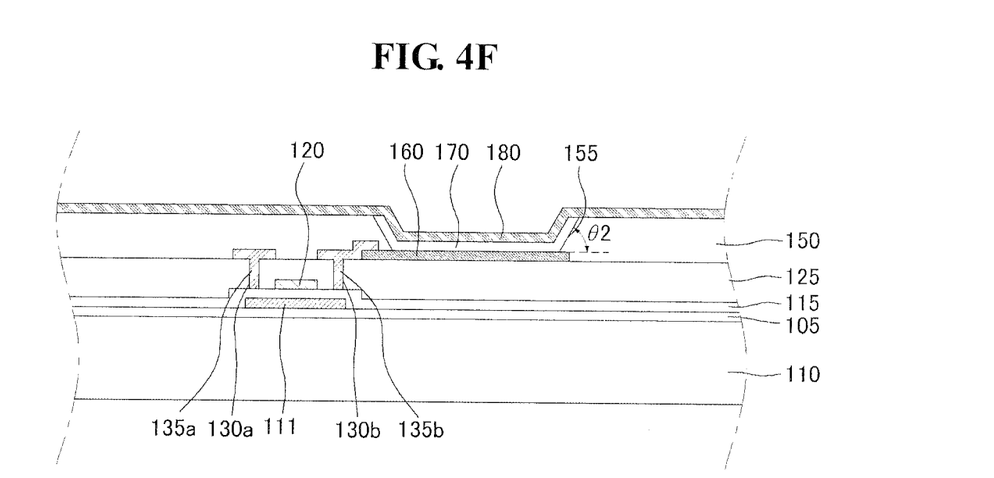

As shown in FIG. 4F, the second electrode 180 is formed on the light emitting layer 170. The second electrode 180 may be a cathode electrode for supplying electrons to the light emitting layer 170. The second electrode 180 may include magnesium (Mg), silver (Ag), calcium (Ca), aluminum (Al), or an alloy thereof.

Accordingly, the organic light emitting device including the first electrode 160, the light emitting layer 170, and the second electrode 180 is completed.

Figure 5:
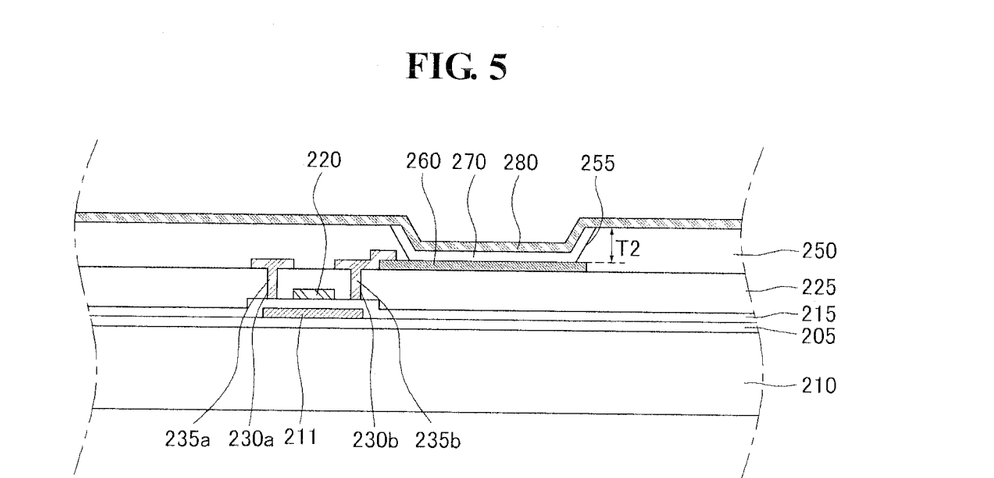
FIG. 5 is a cross-sectional view of an organic light emitting device according to another exemplary embodiment.

FIG. 5 is a cross-sectional view of an organic light emitting device according to another exemplary embodiment.

As shown in FIG. 5, a buffer layer 205 is positioned on a substrate 210. A semiconductor layer 211 is positioned on the buffer layer 205. The semiconductor layer 211 may include amorphous silicon or polycrystalline silicon. A first insulating film 215, which may be a gate insulating film, is positioned on the semiconductor layer 211, and a gate electrode 220 is positioned on the first insulating film 215.

A second insulating film 225, which may be an interlayer dielectric, is formed to insulate the gate electrode 220. Contact holes 230b and 230c are positioned inside the second insulating film 225. A source electrode 235a and a drain electrode 235b are positioned to be electrically connected to the semiconductor layer 211 through the contact holes 230b and 230c.

A first electrode 260 is positioned to be electrically connected to any one of the source and drain electrodes 235a and 235b. A third insulating film 250, which may be a bank layer, is positioned on the first electrode 260. The third insulating film 250 includes an opening 255 exposing a predetermined area of the first electrode 260.

The third insulating film 250 may substantially have a thickness T2 of 0.6 μm to 2 μm as measured from an upper surface of the first electrode 260. When the thickness T2 is equal to or more than 0.6 μm, the third insulating film 250 can be prevented from being damaged by an electric field concentratedly distributed in an edge area of the first electrode 260, and thus insulating properties of the third insulating film 250 can be improved. When the thickness T2 is equal to or less than 2 μm, an evaporation shadow phenomenon, in which a light emitting layer is not evaporated in the edge area of the first electrode 260 in a succeeding evaporation process of the light emitting layer, can be prevented.

A light emitting layer 270 is positioned on an exposed area of the first electrode 260, and a second electrode 280 is positioned on the light emitting layer 270.

As described above, in the organic light emitting device according to another exemplary embodiment, the insulating properties of the third insulating film 250 can be improved and the evaporation shadow phenomenon can be prevented by adjusting the thickness T2 of the third insulating film 250 covering a portion of the first electrode 260.

A method of manufacturing the organic light emitting device according to another exemplary embodiment having the above-described structure will be described below with reference to FIGS. 6A to 6F.

FIGS. 6A to 6F are cross-sectional views successively showing each of process stages in a method of manufacturing the organic light emitting device of FIG. 5.

Figure 6A:
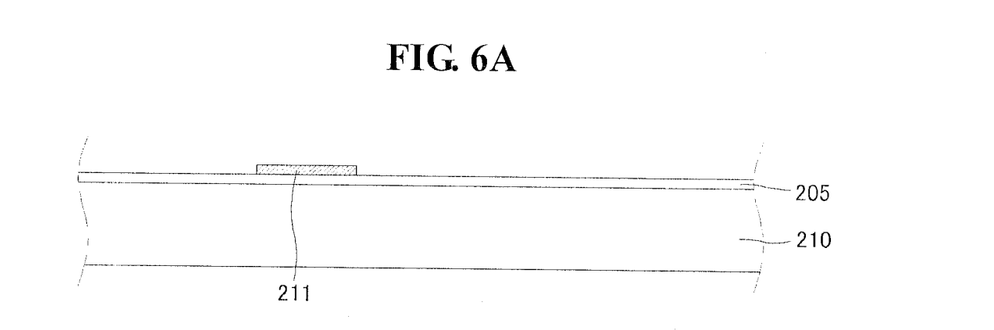
FIGS. 6A to 6F are cross-sectional views successively showing each of process stages in a method of manufacturing the organic light emitting device of FIG. 5.

As shown in FIG. 6A, the buffer layer 205 is formed on the substrate 210 formed of glass, plastic or metal. The buffer layer 205 prevents impurities (e.g., alkali ions discharged from the substrate 210) from being introduced during formation of the thin film transistor in a succeeding process. The buffer layer 205 may be selectively formed using silicon oxide ($SiO_2$), silicon nitride ($SiN_x$), or using other materials.

The semiconductor layer 211 is formed on the buffer layer 205. The semiconductor layer 211 may be formed of amorphous silicon or crystallized polycrystalline silicon. Although it is not shown, the semiconductor layer 211 may include a channel region, a source region, and a drain region, and the source region and the drain region may be doped with p-type or n-type impurities.

Figure 6B:
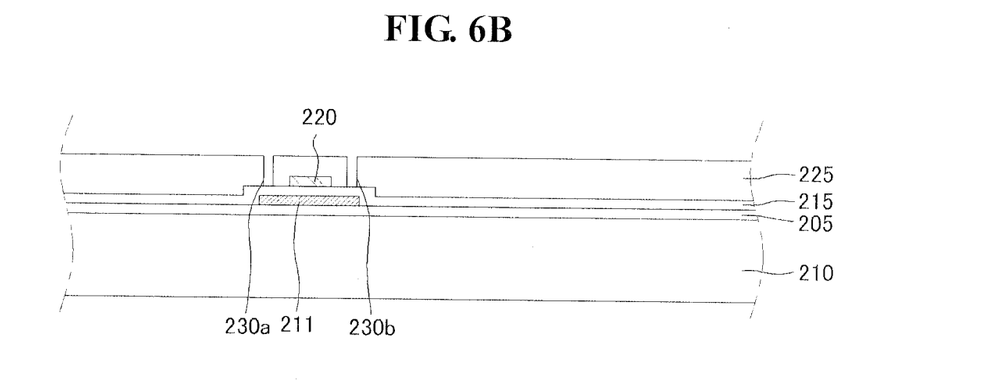

As shown in FIG. 6B, the first insulating film 215 is formed on the substrate 210 including the semiconductor layer 211. The first insulating film 215 may be selectively formed using silicon oxide ($SiO_2$), silicon nitride ($SiN_x$), or using other materials.

Next, the gate electrode 220 is formed on the first insulating film 215 in a given area of the semiconductor layer 210 (e.g., at a location corresponding to the channel region of the semiconductor layer 210 when impurities are doped). The gate electrode 220 may include any one of aluminum (Al), Al alloy, titanium (Ti), silver (Ag), molybdenum (Mo), Mo alloy, tungsten (W), and tungsten silicide ($WSi_2$).

Next, the second insulating film 225 is formed on the substrate 210 including the gate electrode 220. The second insulating film 225 may be an organic film, an inorganic film, or a composite film of the organic film and the inorganic film. In case that the second insulating film 225 is an inorganic film, the second insulating film 225 may include silicon oxide ($SiO_2$), silicon nitride ($SiN_x$), or silicate-on-glass (SOG). In case that the second insulating film 225 is an organic film, the second insulating film 225 may include acrylic resin, polyimide resin, or benzocyclobutene (BCB) resin.

The second insulating film 225 and the first insulating film 215 are etched to form the contact holes 230a and 230b exposing a predetermined area of the semiconductor layer 211.

Figure 6C:
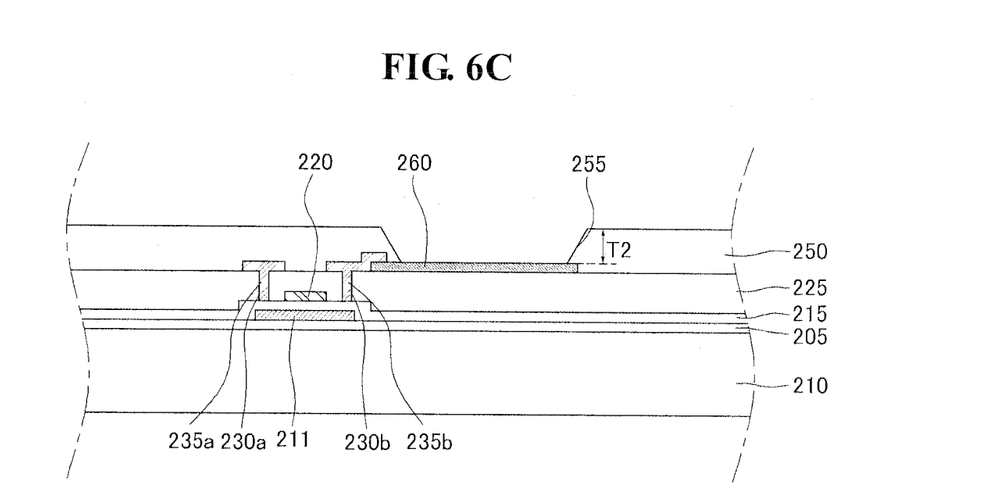

As shown in FIG. 6C, the first electrode 260 is formed on the substrate 210 on which the contact holes 230a and 230b are formed. The first electrode 260 may be an anode electrode and may include a transparent conductive layer such as indium-tin-oxide (ITO) or indium-zinc-oxide (IZO). The first electrode 260 may have a stacked structure of ITO/Ag/ITO.

Next, the source electrode 235a and the drain electrode 235b are formed on the second insulating film 225. The source electrode 235a and the drain electrode 235b are electrically connected to the semiconductor layer 211 through the contact holes 230a and 230b. A portion of the drain electrode 235b is formed on the first electrode 260 and is electrically connected to the first electrode 260.

The source and drain electrodes 235a and 235b may include a low resistance material so as to lower a line resistance. For instance, the source and drain electrodes 235a and 235b may have a multi-layered structure including molybdenum tungsten (MoW), Ti, Al or Al alloy. Examples of the multi-layered structure include a stacked structure of Ti/Al/Ti or MoW/Al/MoW.

Next, the third insulating film 250 is formed on the substrate 210 on which the first electrode 260 is formed. The third insulating film 250 may include an organic material such as benzocyclobutene (BCB) resin, acrylic resin, or polyimide resin. The third insulating film 250 is etched to form the opening 255 exposing a portion of the first electrode 260.

The third insulating film 250 may substantially have the thickness T2 of 0.6 μm to 2 μm as measured from the upper surface of the first electrode 260. When the thickness T2 is equal to or more than 0.6 μm, the third insulating film 250 can be prevented from being damaged by an electric field concentratedly distributed in an edge area of the first electrode 260, and thus the insulating properties of the third insulating film 250 can be improved. When the thickness T2 is equal to or less than 2 μm, the evaporation shadow phenomenon, in which the light emitting layer 270 is not evaporated in the edge area of the first electrode 260 in a succeeding evaporation process of the light emitting layer 270, can be prevented.

Figure 6D:
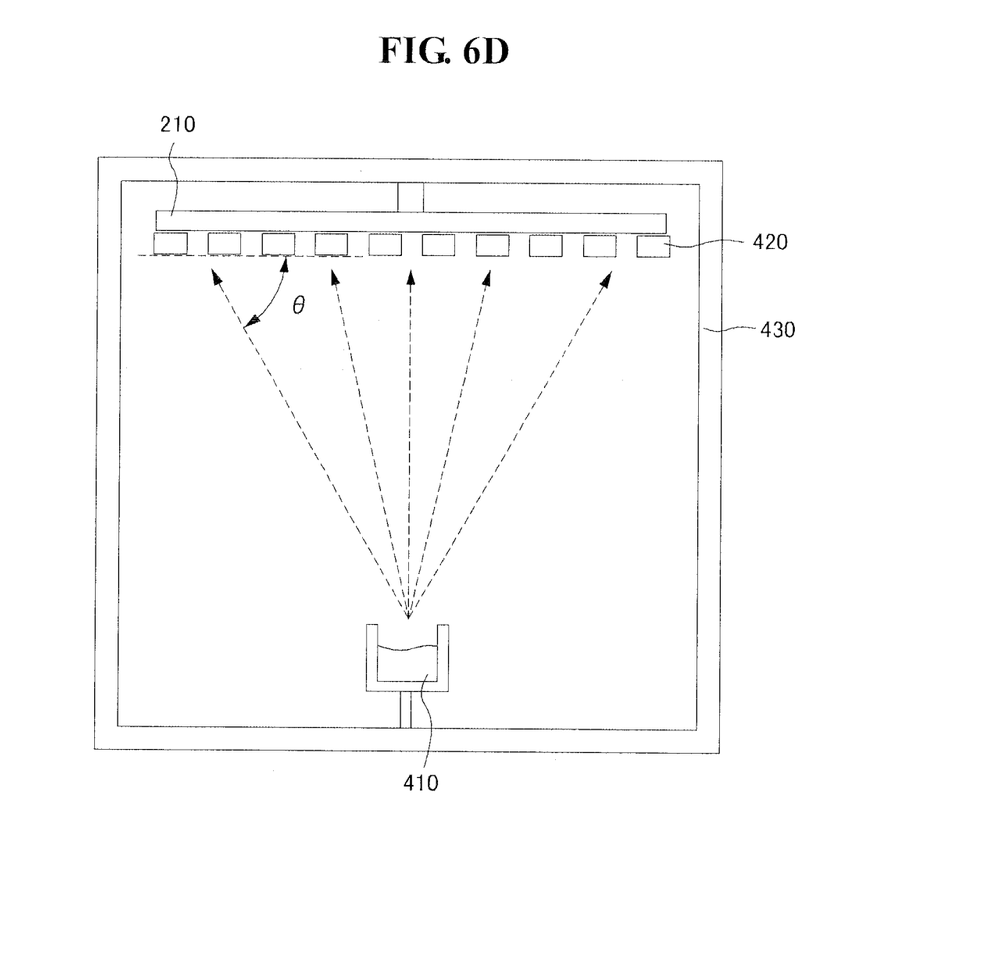

As shown in FIG. 6D, the substrate 210 on which the first electrode 260 and the third insulating film 250 are formed is loaded in a vacuum chamber 430. The vacuum chamber 430 includes an evaporation source 410 including an organic material or an inorganic material. Then, while the substrate 210 and a mask 420 are aligned and heat is applied to the evaporation source 410 positioned in a lower area of the vacuum chamber 430, the light emitting layer 270 is formed on the exposed area of the first electrode 260 exposed by the opening 255 of the third insulating film 250. In FIG. 6D, while the evaporation source 410 is positioned in the lower area of the vacuum chamber 430 at a location corresponding to the middle of the substrate 210, the evaporation source 410 may be positioned outside the substrate 210. In this case, a scattering angle θ of an evaporation material generated in the evaporation source 410 may lie at least in a range between 35° and 55°.

An evaporation shadow phenomenon of an organic material generated during evaporation of the organic material will be described in detail with reference to FIG. 6E.

Figure 6E:
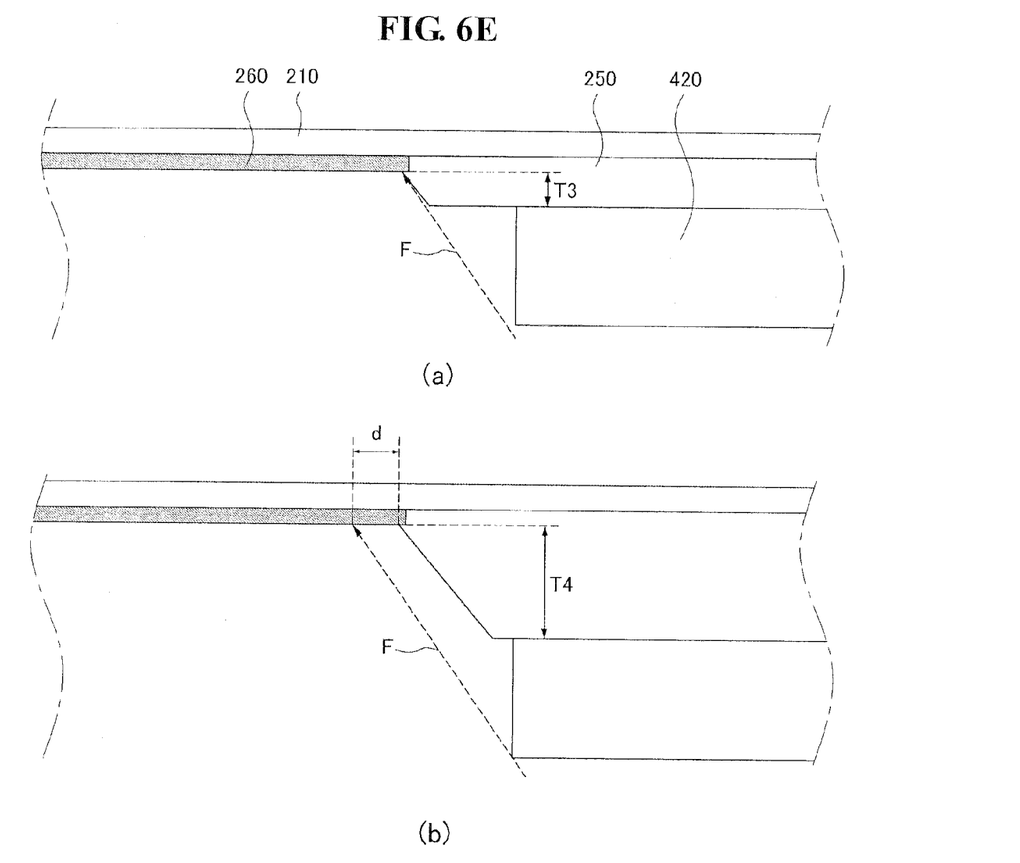

As shown in FIG. 6E, the first electrode 260 is formed on the substrate 210 including the source and drain electrodes 235a and 235b, and the third insulating film 250 is formed to cover a predetermined area of the first electrode 260. A mask 420 is positioned on the third insulating film 250 to evaporate an organic material. FIG. 6E shows an evaporation path (F) of the organic material. A scattering angle of the organic material in (a) of FIG. 6E may be substantially equal to a scattering angle of the organic material in (b) of FIG. 6E.

In FIG. 6E, (a) schematically shows the evaporation of the organic material in case that a thickness T3 of the third insulating film 250 covering a portion of the first electrode 260 lies substantially in a range between 0.6 μm and 2 μm as measured from the upper surface of the first electrode 260. As shown, when the thickness T3 lies substantially in a range between 0.6 μm and 2 μm, the organic material is evaporated up to the edge area of the third insulating film 250 contacting the first electrode 260.

In FIG. 6E, (b) schematically shows the evaporation of the organic material in case that a thickness T4 of the third insulating film 250 covering a portion of the first electrode 260 exceeds 2 μm as measured from the upper surface of the first electrode 260. As shown, when the thickness T4 exceeds 2 μm, an evaporation shadow phenomenon, in which the organic material is not evaporated in the edge area of the third insulating film 250 contacting the first electrode 260 using the mask 220, occurs. In other words, the evaporation shadow phenomenon starts to occur from the edge area of the third insulating film 250 contacting the first electrode 260. As a result, the evaporation shadow phenomenon generates dark spots on an image and easily deteriorates the light emitting layer due to oxygen permeated from the outside. In (b) of FIG. 6E, a reference character "d" indicates an evaporation shadow distance of the first distance 260 on which the organic material is not evaporated using the mask 420.

Accordingly, since the thickness of the third insulating film 250 covering a portion of the first electrode 260 lies substantially in a range between 0.6 μm and 2 μm as measured from the upper surface of the first electrode 260 in the organic light emitting device according to another exemplary embodiment, the display quality of an image displayed on the organic light emitting device can be improved and the reliability of the organic light emitting device can be improved.

Although it is not shown, before forming the light emitting layer 270, a hole injection layer and a hole transport layer may be formed on the substrate 210. After forming the light emitting layer 270, an electron transport layer and an electron injection layer may be formed on the light emitting layer 270. The light emitting layer 270 may be formed using a thermal evaporation method.

Figure 6F:
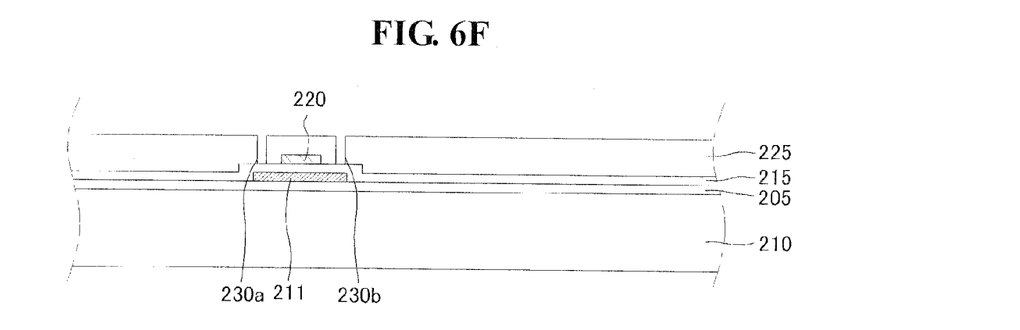

As shown in FIG. 6F, the second electrode 280 is formed on the light emitting layer 270. The second electrode 280 may be a cathode electrode for supplying electrons to the light emitting layer 270. The second electrode 280 may include magnesium (Mg), silver (Ag), calcium (Ca), aluminum (Al), or an alloy thereof.

Accordingly, the organic light emitting device including the first electrode 260, the light emitting layer 270, and the second electrode 280 is completed.

Various color image display methods may be implemented in the organic light emitting device such as described above. These methods will be described below with reference to FIGS. 7A to 7C.

Figure 7A:
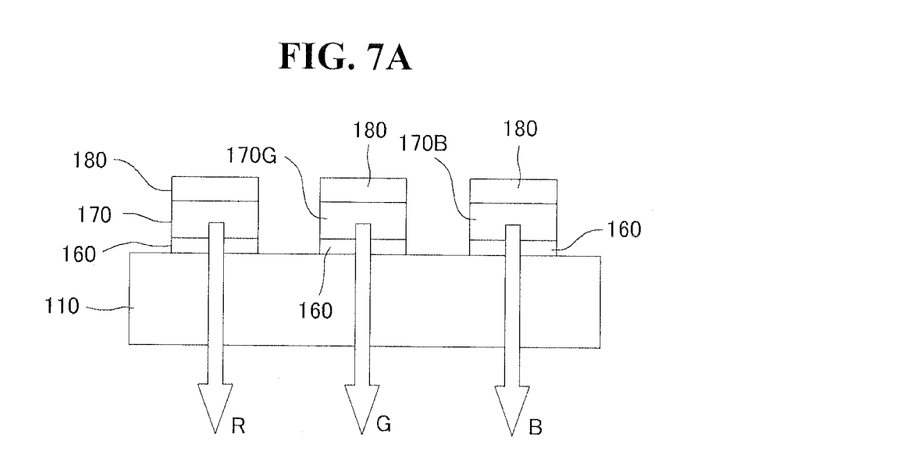
FIGS. 7A to 7C illustrate various implementations of a color image display method in the organic light emitting device according to the exemplary embodiment.
Figure 7B:
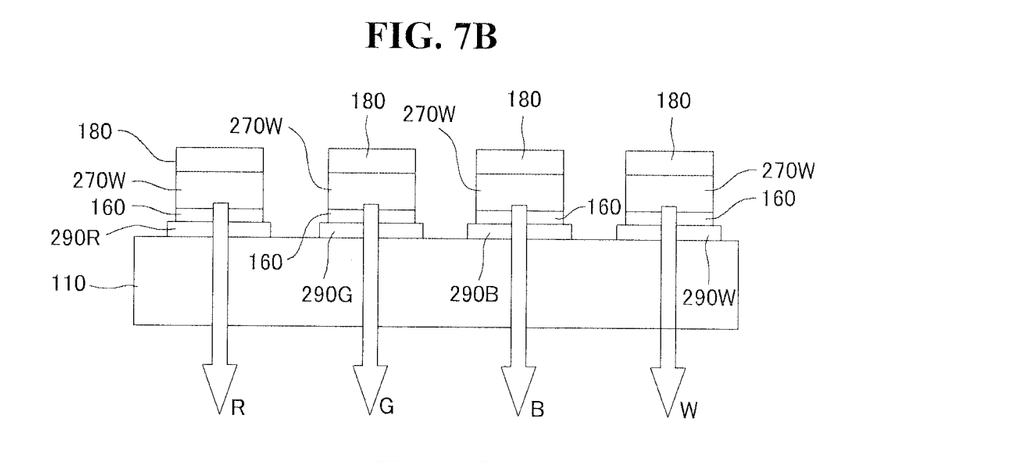
Figure 7C:
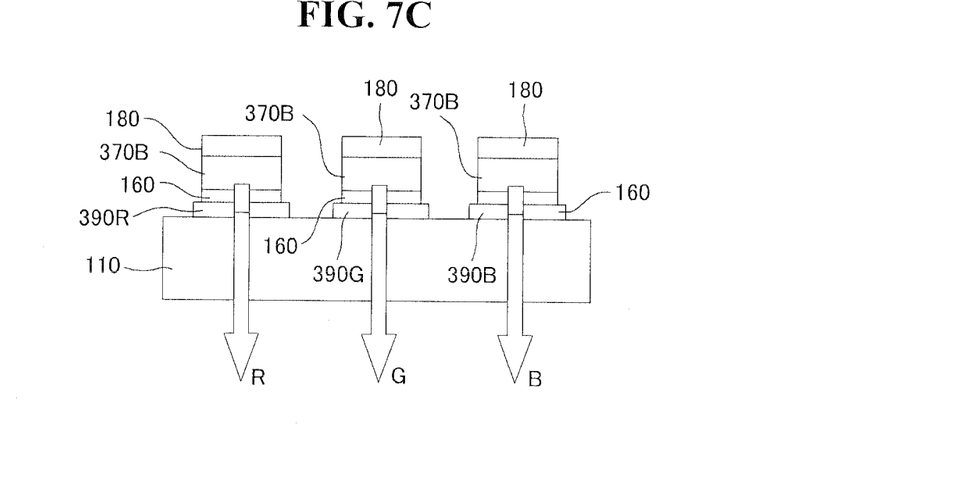

FIGS. 7A to 7C illustrate various implementations of a color image display method in the organic light emitting device according to the exemplary embodiment.

FIG. 7A illustrates a color image display method in an organic light emitting device that separately includes a red light emitting layer 170R to emit red light, a green light emitting layer 170G to emit green light, and a blue light emitting layer 170B to emit blue light. The red, green and blue light produced by the red, green and blue light emitting layers 170R, 170G and 170B is mixed to display a color image.

In FIG. 7A, the red, green and blue light emitting layers 170R, 170G and 170B may each include an electron transport layer, a hole transport layer, and the like. It is possible to variously change an arrangement and a structure between additional layers such as the electron transport layer and the hole transport layer and each of the red, green and blue light emitting layers 170R, 170G and 170B.

FIG. 7B illustrates a color image display method in an organic light emitting device including a white light emitting layer 270W, a red color filter 290R, a green color filter 290G, a blue color filter 290B, and a white color filter 290W.

As shown in FIG. 7B, the red color filter 290R, the green color filter 290G, the blue color filter 290B, and the white color filter 290W each transmit white light produced by the white light emitting layer 270W and produce red light, green light, blue light, and white light. The red, green, blue, and white light is mixed to display a color image. The white color filter 290W may be removed depending on color sensitivity of the white light produced by the white light emitting layer 270W and combination of the white light and the red, green and blue light.

While FIG. 7B has illustrated the color display method of four subpixels using combination of the red, green, blue, and white light, a color display method of three subpixels using combination of the red, green, and blue light may be used.

In FIG. 7B, the white light emitting layer 270W may include an electron transport layer, a hole transport layer, and the like. It is possible to variously change an arrangement and a structure between additional layers such as the electron transport layer and the hole transport layer and the white light emitting layer 270W.

FIG. 7C illustrates a color image display method in an organic light emitting device including a blue light emitting layer 370B, a red color change medium 390R, a green color change medium 390G, and a blue color change medium 390B.

As shown in FIG. 7C, the red color change medium 390R, the green color change medium 390G, and the blue color change medium 390B each transmit blue light produced by the blue light emitting layer 370B to produce red light, green light and blue light. The red, green and blue light is mixed to display a color image.

The blue color change medium 390B may be removed depending on color sensitivity of the blue light produced by the blue light emitting layer 370B and combination of the blue light and the red and green light.

In FIG. 7C, the blue light emitting layer 370B may include an electron transport layer, a hole transport layer, and the like. It is possible to variously change an arrangement and a structure between additional layers such as the electron transport layer and the hole transport layer and the blue light emitting layer 370B.

While FIGS. 7A to 7C have illustrated and described the organic light emitting device having a bottom emission structure, the exemplary embodiment is not limited thereto. The display device according to the exemplary embodiment may have a top emission structure, and thus can a different arrangement and a different structure depending on the top emission structure.

While FIGS. 7A to 7C have illustrated and described three kinds of color image display method, the exemplary embodiment is not limited thereto. The exemplary embodiment may use various kinds of color image display method whenever necessary.

Figure 8:
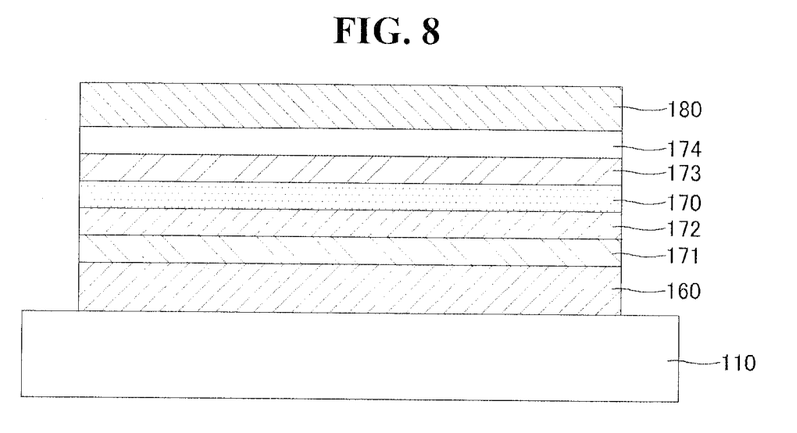
FIG. 8 is a cross-sectional view of the organic light emitting device according to the exemplary embodiment.

FIG. 8 is a cross-sectional view of the organic light emitting device according to the exemplary embodiment.

As shown in FIG. 8, the organic light emitting device according to the exemplary embodiment includes the substrate 110, the first electrode 160 on the substrate 110, a hole injection layer 171 on the first electrode 160, a hole transport layer 172, a light emitting layer 170, an electron transport layer 173, an electron injection layer 174, and the second electrode 180 on the electron injection layer 174.

The hole injection layer 171 may function to facilitate the injection of holes from the first electrode 160 to the light emitting layer 170. The hole injection layer 171 may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto. The hole injection layer 171 may be formed using an evaporation method or a spin coating method.

The hole transport layer 172 functions to smoothly transport holes. The hole transport layer 172 may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto. The hole transport layer 172 may be formed using an evaporation method or a spin coating method.

The light emitting layer 170 may be formed of a material capable of producing red, green, blue and white light, for example, a phosphorescence material or a fluorescence material.

In case that the light emitting layer 170 produces red light, the light emitting layer 170 includes a host material including carbazole biphenyl (CBP) or N,N-dicarbazolyl-3,5-benzene (mCP). Further, the light emitting layer 170 may be formed of a phosphorescence material including a dopant material including any one selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the light emitting layer 170 produces green light, the light emitting layer 170 includes a host material including CBP or mCP. Further, the light emitting layer 170 may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case that the light emitting layer 170 produces blue light, the light emitting layer 170 includes a host material including CBP or mCP. Further, the light emitting layer 170 may be formed of a phosphorescence material including a dopant material including (4,6-F2ppy)2Irpic or a fluorescence material including any one selected from the group consisting of spiro-DPVBi, spiro-6P, distyryl-benzene (DSB), distyryl-arylene (DSA), PFO-based polymers, PPV-based polymers and a combination thereof, but is not limited thereto.

The electron transport layer 173 functions to facilitate the transportation of electrons. The electron transport layer 173 may be formed of at least one selected from the group consisting of Alq3(tris(8-hydroxyquinolino)aluminum, PBD, TAZ, spiro-PBD, BAlq, and SAlq, but is not limited thereto. The electron transport layer 173 may be formed using an evaporation method or a spin coating method.

The electron transport layer 173 can also function to prevent holes, which are injected from the first electrode 160 and then pass through the light emitting layer 170, from moving to the second electrode 180. In other words, the electron transport layer 173 serves as a hole stop layer, which facilitates the coupling of holes and electrons in the light emitting layer 170.

The electron injection layer 174 functions to facilitate the injection of electrons. The electron injection layer 174 may be formed of Alq3(tris(8-hydroxyquinolino)aluminum), PBD, TAZ, spiro-PBD, BAlq or SAlq, but is not limited thereto. The electron injection layer 174 may be formed of an organic material and an inorganic material forming the electron injection layer 174 through a vacuum evaporation method.

The hole injection layer 171 or the electron injection layer 174 may further include an inorganic material. The inorganic material may further include a metal compound. The metal compound may include alkali metal or alkaline earth metal. The metal compound including the alkali metal or the alkaline earth metal may include at least one selected from the group consisting of LiQ, LiF, NaF, KF, RbF, CsF, FrF, BeF$_2$, MgF$_2$, CaF$_2$, SrF$_2$, BaF$_2$, and RaF$_2$, but is not limited thereto.

Thus, the inorganic material inside the electron injection layer 174 facilitates hopping of electrons injected from the second electrode 180 to the light emitting layer 170, so that holes and electrons injected into the light emitting layer 170 are balanced. Accordingly, the light emission efficiency can be improved.

Further, the inorganic material inside the hole injection layer 171 reduces the mobility of holes injected from the first electrode 160 to the light emitting layer 170, so that holes and electrons injected into the light emitting layer 170 are balanced. Accordingly, the light emission efficiency can be improved.

At least one of the electron injection layer 174, the electron transport layer 173, the hole transport layer 172, the hole injection layer 171 may be omitted.

Experimental examples of the organic light emitting device according to the exemplary embodiments will be described below.

EXPERIMENTAL EXAMPLE 1

Indium-tin-oxide (ITO) was evaporated on a glass substrate, on which a thin film transistor was formed, at a thickness of 430 nm, and was patterned to a first electrode. Polyimide was spin-coated on the first electrode at a thickness of 1.6 μm to form a third insulating film. A predetermined area of the third insulating film was patterned using a photolithography method to form an opening exposing the predetermined area of the third insulating film.

The substrate on which the third insulating film was formed was loaded in a vacuum chamber, and the substrate and a shadow mask were aligned. Then, m-MTDATA(4,4',4"-Tris(N-3-methylphenyl-N-phenyl-amino)-triphenylamine) was formed at a thickness of 130 nm to form a hole injection layer, and NPB(n-propyl bromide) was formed at a thickness of 20 nm to form a hole transport layer. DPVBi(4,4"-bis(2,2'-diphenyl vinyl)-1,1'-biphenyl) as a host and perylene as a dopant were mixed at a concentration of 2 wt % on the hole transport layer to form a blue light emitting layer having a thickness of 20 nm. PBD(2-(4-biphenylyl)-5-(4-tert-butyl)-1,3,4-oxadiazole) was formed at a thickness of 30 nm to form an electron transport layer.

After performing an evaporation process on an organic material, an evaporation shadow distance of the substrate was measured. In this case, a scattering angle of the organic material was 52°.

EXPERIMENTAL EXAMPLE 2

The experimental example 2 was conducted in the same manner as the experimental example 1 except that a thickness of the third insulating film was 1.8 μm.

EXPERIMENTAL EXAMPLE 3

The experimental example 3 was conducted in the same manner as the experimental example 1 except that a thickness of the third insulating film was 2.0 μm.

COMPARATIVE EXAMPLE 1

The comparative example 1 was conducted in the same manner as the experimental example 1 except that a thickness of the third insulating film was 2.2 μm.

COMPARATIVE EXAMPLE 2

The comparative example 2 was conducted in the same manner as the experimental example 1 except that a thickness of the third insulating film was 2.4 μm.

COMPARATIVE EXAMPLE 3

The comparative example 3 was conducted in the same manner as the experimental example 1 except that a thickness of the third insulating film was 2.6 μm.

COMPARATIVE EXAMPLE 4

The comparative example 4 was conducted in the same manner as the experimental example 1 except that a thickness of the third insulating film was 2.8 μm.

COMPARATIVE EXAMPLE 5

The comparative example 5 was conducted in the same manner as the experimental example 1 except that a thickness of the third insulating film was 3.0 μm.

An evaporation shadow distance of each of the organic light emitting devices manufactured according to the experimental examples 1 to 3 and the comparative examples 1 to 5 was measured, and was indicated in the following table 1.

TABLE 1

| | Thickness of third insulating film (μm) | Increase in thickness of third insulating film (μm) | Evaporation shadow distance (μm) |
| --- | --- | --- | --- |
| Experimental example 1 | 1.6 | 0 | 0 |
| Experimental example 2 | 1.8 | 0.2 | 0 |
| Experimental example 3 | 2.0 | 0.2 | 0 |
| Comparative example 1 | 2.2 | 0.2 | 0.031 |
| Comparative example 2 | 2.4 | 0.2 | 0.062 |
| Comparative example 3 | 2.6 | 0.2 | 0.093 |
| Comparative example 4 | 2.8 | 0.2 | 0.124 |
| Comparative example 5 | 3.0 | 0.2 | 0.155 |

The above table 1 indicates that an evaporation shadow phenomenon did not occur in the experimental examples 1 to 3 and an evaporation shadow phenomenon occurred in the comparative examples 1 to 5 including the third insulating film having the thickness larger than 2.0 μm.

As described above, in the organic light emitting device according to the exemplary embodiments, the evaporation shadow phenomenon during formation of the light emitting layer can be prevented by adjusting the taper angle of the edge area of the third insulating film contacting the first electrode, and thus the display quality and the reliability of the organic light emitting device can be improved.

As described above, in the organic light emitting device according to the exemplary embodiments, the evaporation shadow phenomenon during formation of the light emitting layer can be prevented by adjusting the thickness of the third insulating film, and thus the display quality and the reliability of the organic light emitting device can be improved.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A method of manufacturing an organic light emitting device comprising:
   forming a gate electrode on a substrate;
   forming a first insulating film on the gate electrode;
   forming a semiconductor layer on the first insulating film;
   forming a second insulating film on the semiconductor layer;
   forming a first electrode on the second insulating film;
   forming source and drain electrodes connected to the semiconductor layer, the drain electrode being connected to the first electrode and covers a part of the first electrode;
   forming a bank layer on the first electrode;
   etching the bank layer so that a taper angle of an edge area of the bank layer contacting the first electrode lies substantially in a range between 20° and 35°;
   forming a light emitting layer on the first electrode by evaporating an evaporation material generated in an evaporation source; and
   forming a second electrode on the light emitting layer, wherein the taper angle of the edge area of the bank layer is an angle between a surface of the first electrode and a surface of the light emitting layer, and the taper angle prevents damage by an electric field concentration and evaporation shadow phenomenon in the edge area, and wherein a scattering angle of the evaporation material lies substantially in a range between 35° and 55°.

\* \* \* \* \*